(12) United States Patent
Mori et al.

(10) Patent No.: US 7,944,657 B2
(45) Date of Patent: May 17, 2011

(54) ELECTROSTATIC DISCHARGE PROTECTION CIRCUIT

(75) Inventors: Hideki Mori, Kanagawa (JP); Kentaro Kasai, Kagoshima (JP)

(73) Assignee: Sony Corporation, Tokyo (JP)

( * ) Notice: Subject to any disclaimer, the term of this patent is extended or adjusted under 35 U.S.C. 154(b) by 109 days.

(21) Appl. No.: 12/283,681

(22) Filed: Sep. 15, 2008

(65) Prior Publication Data

US 2009/0097177 A1   Apr. 16, 2009

(30) Foreign Application Priority Data

Oct. 10, 2007   (JP) ............................... P2007-264702
Mar. 10, 2008   (JP) ............................... P2008-059502

(51) Int. Cl.
*H02H 9/00*   (2006.01)
*H01C 7/12*   (2006.01)
*H02H 1/00*   (2006.01)
*H02H 1/04*   (2006.01)
*H02H 3/22*   (2006.01)
*H02H 9/06*   (2006.01)

(52) U.S. Cl. ........................... 361/56; 361/118; 361/91.1
(58) Field of Classification Search .................. 361/56, 361/118
See application file for complete search history.

(56) References Cited

U.S. PATENT DOCUMENTS

| 5,182,220 A | * | 1/1993 | Ker et al. | ................ | 438/200 |
| 5,994,741 A | * | 11/1999 | Koizumi et al. | ................ | 257/355 |
| 7,440,248 B2 | * | 10/2008 | Arai et al. | ................ | 361/56 |

FOREIGN PATENT DOCUMENTS

JP   2003-133434   5/2003

* cited by examiner

*Primary Examiner* — Dharti H Patel
(74) *Attorney, Agent, or Firm* — Robert J. Depke; Rockey, Depke & Lyons, LLC (57) ABSTRACT

An electrostatic protection circuit includes a first impurity region, a second impurity region, a first electrode, a third impurity region, a fourth impurity region, a second electrode, a fifth impurity region, a sixth impurity region, a third electrode, a gate insulating film, and a fourth electrode.

8 Claims, 9 Drawing Sheets

ELECTROSTATIC DISCHARGE PROTECTION CIRCUIT

CROSS REFERENCES TO RELATED APPLICATIONS

The present invention contains subject matter related to Japanese Patent Applications JP 2007-264702, and JP 2008-059502 all filed with the Japan Patent Office on Oct. 10, 2007, and Mar. 10, 2008, respectively the entire contents of which being incorporated herein by reference.

BACKGROUND OF THE INVENTION

1. Field of the Invention

The present invention relates to an electrostatic protection circuit that diverts a surge voltage applied to a signal line away from the circuit that should be protected.

2. Description of Related Art

In general, a semiconductor integrated circuit (IC) is susceptible to a surge voltage arising due to electrostatic discharge (ESD), and is easily broken by the surge voltage. The surge voltage frequently arises when a human (user), who can store therein static electricity of about 2000 V, treats an IC without taking measures against static electricity.

Typically, in order to protect an IC from the surge voltage, an electrostatic protection circuit that diverts the surge voltage away from the circuit that should be protected is provided in the IC. For example, a signal line and a ground potential line of the IC are connected to each other via a diode. In this case, the diode is turned on when the surge voltage is applied to the signal line, and thus the surge voltage can be diverted into the ground potential line. Alternatively, it is also possible to provide a field effect transistor (FET) between the signal line and the ground potential line instead of the diode and control the FET in the gate-controlled drain avalanche breakdown mode, to thereby divert the surge voltage into the ground potential line.

Figure 10:
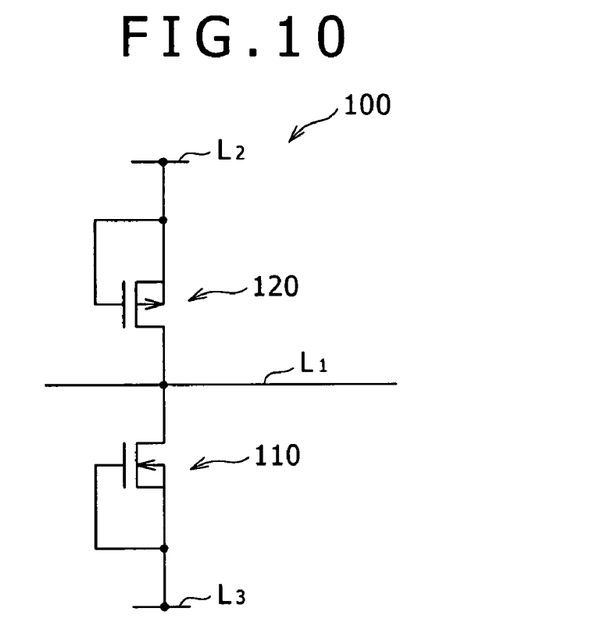
FIG. 10 is a circuit arrangement diagram of a related-art electrostatic protection circuit.

Furthermore, it is also possible to divert the surge voltage away from the circuit that should be protected by using e.g. metal-oxide-semiconductor (MOS) transistors. FIG. 10 is a diagram showing one example of the circuit arrangement of the electrostatic protection circuit employing MOS transistors. An electrostatic protection circuit 100 shown in FIG. 10 includes an n-type MOS transistor 110 and a p-type MOS transistor 120. The n-type MOS transistor 110 has a gate, source, drain, and p-type semiconductor substrate. The gate, source, and p-type semiconductor substrate of the n-type MOS transistor 110 are connected to a ground line $L_3$, and the drain of the n-type MOS transistor 110 is connected to a signal line $L_1$. The p-type MOS transistor 120 has a gate, source, drain, and n-type semiconductor substrate. The gate, source, and n-type semiconductor substrate of the p-type MOS transistor 120 are connected to a power supply line $L_2$, and the drain of the p-type MOS transistor 120 is connected to the signal line $L_1$. Due to this arrangement, the electrostatic protection circuit 100 does not operate when a signal voltage is applied to the signal line. On the other hand, when a surge voltage is applied to the signal line, the p-type MOS transistor 120 is turned on, or the breakdown of the n-type MOS transistor 110 is caused, depending on the magnitude of the surge voltage. This operation makes it possible to divert the surge voltage away from the circuit that should be protected (refer to Japanese Patent Laid-open No. 2003-133434).

SUMMARY OF THE INVENTION

Figure 11:
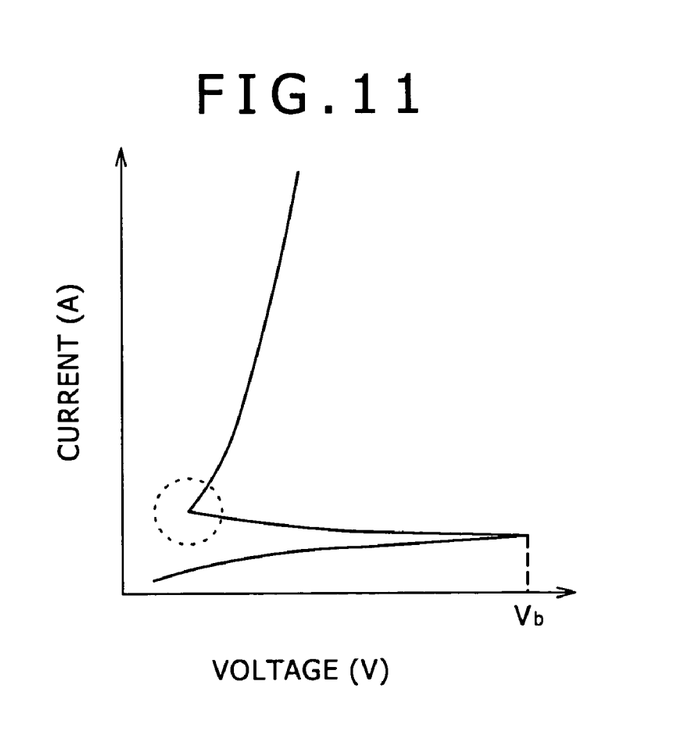
FIG. 11 is a characteristic diagram showing one example of the current-voltage characteristic of the related-art electrostatic protection circuit.

A MOS transistor for high-breakdown-voltage driving is often used for the above-described electrostatic protection circuit 100. For this MOS transistor for high-breakdown-voltage driving, the breakdown voltage Vb (see FIG. 11) thereof is set high so that the MOS transistor can withstand high voltage. Therefore, the following problem will occur when the MOS transistor for high-breakdown-voltage driving is used for the electrostatic protection circuit 100. Specifically, when a signal voltage is applied to the signal line, the temperature surpasses the allowable temperature at the moment of snap-back (see the area surrounded by the dashed line in FIG. 11) because the heat generation amount is large although the current is small, and thus the MOS transistor itself in the electrostatic protection circuit 100 is broken.

There is a need for the present invention to provide an electrostatic protection circuit that is prevented from being broken due to a surge voltage and a semiconductor device including the electrostatic protection circuit.

According to an embodiment of the present invention, there is provided a first electrostatic protection circuit including the following components (A) to (K). According to another embodiment of the present invention, there is provided a semiconductor device that has over a semiconductor substrate the first electrostatic protection circuit including the following components (A) to (K).

(A) a first impurity region configured to contain an impurity of a first conductivity type, (B) a second impurity region configured to be formed on the surface of the first impurity region and contain an impurity of the first conductivity type with concentration higher than the concentration of the impurity of the first conductivity type in the first impurity region, (C) a first electrode configured to be formed on the surface of the second impurity region and be electrically connected to a signal line, (D) a third impurity region configured to be formed on the surface of the first impurity region and contain an impurity of a second conductivity type different from the first conductivity type, (E) a fourth impurity region configured to be formed on the surface of the third impurity region and contain an impurity of the second conductivity type with concentration higher than the concentration of the impurity of the second conductivity type in the third impurity region, (F) a second electrode configured to be formed on the surface of the fourth impurity region and be electrically connected to the signal line, (G) a fifth impurity region configured to be formed in an area adjacent to the third impurity region, of a surface area of the first impurity region, and contain an impurity of the second conductivity type, (H) a sixth impurity region configured to be formed on the surface of the fifth impurity region and contain an impurity of the first conductivity type, (I) a third electrode configured to be formed on the surface of the sixth impurity region and be electrically connected to a reference potential line, (J) a gate insulating film configured to be formed at least on the part of the surface of the first impurity region, between the third impurity region and the fifth impurity region, and (K) a fourth electrode configured to be formed on the surface of the gate insulating film and be electrically connected to the reference potential line when a surge voltage is applied to the signal line.

In the first electrostatic protection circuit and the semiconductor device according to the embodiments of the present invention, a bipolar transistor is formed by the first impurity region, the fifth impurity region, and the sixth impurity region, and a MOS transistor is formed by the first impurity region, the third impurity region, the fifth impurity region, the gate insulating film, and the fourth electrode. The fifth impurity region serves as both the base of the bipolar transistor and the drain or source of the MOS transistor, and therefore it can be said that the base of the bipolar transistor and the drain or source of the MOS transistor are electrically connected to each other. Due to this feature, in the case in which a surge voltage is applied to the signal line so as to be transmitted to the first impurity region and the third impurity region and thus the voltage of the first impurity region and the third impurity region becomes the surge voltage, when the third electrode and the fourth electrode are electrically connected to the reference potential line, a channel is formed in the partial portion of the first impurity region directly beneath the fourth electrode, so that the surge voltage of the third impurity region is transmitted to the fifth impurity region via the channel. When the surge voltage is thus transmitted to the fifth impurity region, the junction between the fifth impurity region and the sixth impurity region electrically connected to the reference potential line is forward-biased. Furthermore, because the voltage of the first impurity region is the surge voltage, the bipolar transistor starts its bipolar operation, so that the surge voltage is discharged from the first impurity region to the sixth impurity region via the fifth impurity region.

According to yet another embodiment of the present invention, there is provided a second electrostatic protection circuit including a bipolar transistor and a MOS transistor. The bipolar transistor has a base, a collector electrically connected to a signal line, and an emitter electrically connected to a reference potential line. The MOS transistor has a gate, a source, and a drain. The gate is electrically connected to the reference potential line when a surge voltage is applied to the signal line. One of the source and the drain is electrically connected to the signal line, and the other thereof is electrically connected to the base.

In the second electrostatic protection circuit according to this embodiment of the present invention, the base of the bipolar transistor and the source or drain of the MOS transistor are electrically connected to each other. Due to this feature, in the case in which a surge voltage is applied to the signal line so as to be transmitted to the collector and the source or drain electrically connected to the signal line and thus the voltage of the collector and the source becomes the surge voltage, when the emitter is electrically connected to the reference potential line, a channel is formed in the MOS transistor, so that the surge voltage of the source or drain electrically connected to the signal line is transmitted to the base via the channel. When the surge voltage is thus transmitted to the base, the junction between the base and the emitter electrically connected to the reference potential line is forward-biased. Furthermore, because the voltage of the collector is the surge voltage, the bipolar transistor starts its bipolar operation, so that the surge voltage is discharged from the collector to the emitter via the base.

In the first electrostatic protection circuit and the semiconductor device according to the embodiments of the present invention, the fifth impurity region is so designed as to serve as both the base of the bipolar transistor and the drain or source of the MOS transistor. Thus, the trigger of the bipolar operation at the time of the electrostatic protection can be controlled based on the threshold voltage of the MOS transistor. This can start the electrostatic protection operation with low voltage, which can prevent breakdown of the electrostatic protection circuit itself due to a surge voltage.

In the second electrostatic protection circuit according to the embodiment of the present invention, the base of the bipolar transistor and the drain or source of the MOS transistor are electrically connected to each other. Thus, the trigger of the bipolar operation at the time of the electrostatic protection can be controlled based on the threshold voltage of the MOS transistor. This can start the electrostatic protection operation with low voltage, which can prevent breakdown of the electrostatic protection circuit itself due to a surge voltage.

DETAILED DESCRIPTION OF THE PREFERRED EMBODIMENTS

Embodiments of the present invention will be described in detail below with reference to the drawings.

First Embodiment

Figure 1:
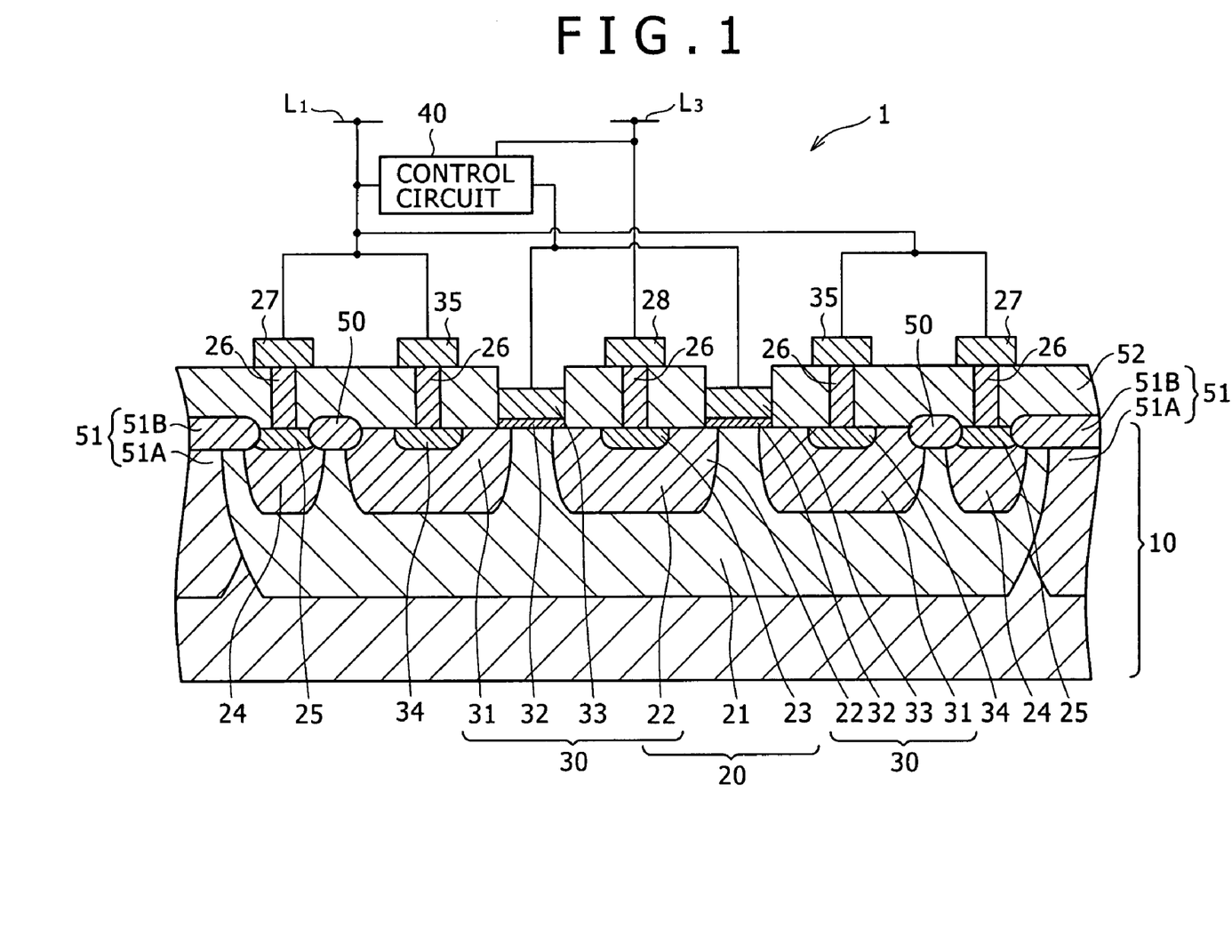
FIG. 1 is a sectional structural diagram of an electrostatic protection circuit according to a first embodiment of the present invention.

FIG. 1 is a diagram showing the sectional structure and the connection relationship of an electrostatic protection circuit 1 according to a first embodiment of the present invention. The electrostatic protection circuit 1 of the present embodiment is formed over a silicon substrate together with an integrated circuit in a semiconductor device, and is provided and connected between a signal line $L_1$ electrically connected to the integrated circuit and a ground line $L_3$ (reference potential line).

As shown in FIG. 1, this electrostatic protection circuit 1 includes, over a substrate 10, one bipolar transistor 20, two MOS transistors 30, and a control circuit 40.

The semiconductor substrate 10 is e.g. a silicon substrate containing a p-type impurity.

The bipolar transistor 20 has a collector region 21 formed to have a large depth around the surface of the semiconductor substrate 10, a base region 22 formed on a part of the surface of the collector region 21, and an emitter region 23 formed on a part of the surface of the base region 22.

The collector region 21 contains e.g. an impurity of a conductivity type (n-type) different from that of the semiconductor substrate 10. The base region 22 contains e.g. an impurity of the same conductivity type (p-type) as that of the semiconductor substrate 10. The emitter region 23 contains e.g. an impurity of a conductivity type (n-type) different from that of the semiconductor substrate 10, with impurity concentration higher than that of the collector region 21.

At two places on the surface of the collector region 21, first collector potential extraction regions 24 are formed. The first collector potential extraction region 24 contains an impurity of the same conductivity type as that of the collector region 21, with impurity concentration higher than that of the collector region 21, and is electrically connected to the collector region 21. Furthermore, second collector potential extraction regions 25 are formed on the surfaces of the respective first collector potential extraction regions 24. The second collector potential extraction region 25 contains an impurity of the same conductivity type as that of the first collector potential extraction region 24, with impurity concentration higher than that of the first collector potential extraction region 24, and is electrically connected to the first collector potential extraction region 24. Over the surfaces of the respective second collector potential extraction regions 25, collector electrodes 27 are formed with the intermediary of vias 26 therebetween. The via 26 and the collector electrode 27 are composed of e.g. a metal such as aluminum (Al) and are electrically connected to the second collector potential extraction region 25. Therefore, the collector electrode 27 is electrically connected to the collector region 21 via the via 26, the second collector potential extraction region 25, and the first collector potential extraction region 24. The collector electrode 27 is electrically connected also to the signal line $L_1$.

Over the surface of the emitter region 23, an emitter electrode 28 is formed with the intermediary of the via 26 therebetween. The emitter electrode 28 is composed of e.g. a metal such as aluminum (Al) and is electrically connected to the emitter region 23 via the via 26. In addition, the emitter electrode 28 is always electrically connected to the ground line $L_3$.

Two MOS transistors 30 are formed in areas adjacent to the bipolar transistor 20, of the surface area of the collector region 21. Each MOS transistor 30 has a source region 31 and a drain region formed on the surface of the collector region 21, a gate insulating film 32 formed at least on the part of the surface of the collector region 21, between the source region 31 and the drain region, and a gate electrode 33 formed on the gate insulating film 32. FIG. 1 shows an example in which the gate insulating film 32 is formed over a part of the surface of the source region 31, a part of the surface of the drain region, and the part of the surface of the collector region 21, between the source region 31 and the drain region.

The source region 31 contains e.g. an impurity of the same conductivity type (p-type) as that of the semiconductor substrate 10. The drain region contains e.g. an impurity of the same conductivity type (p-type) as that of the semiconductor substrate 10. The drain region is electrically connected to the base region 22 of the bipolar transistor 20, or is formed monolithically with (or is used also as) the base region 22 of the bipolar transistor 20. This drain region (the base region 22) is surrounded by regions of the different conductivity type (the collector region 21 and the emitter region 23) and an insulating layer 52 to be described later, and is not electrically connected to other regions but electrically floating. The gate insulating film 32 is composed of e.g. silicon oxide ($SiO_2$). The gate electrode 33 has e.g. a two-layer structure obtained by sequentially stacking, from the gate insulating film side, a poly-silicon layer containing an impurity of the same conductivity type (p-type) as that of the semiconductor substrate 10 and a silicide layer.

Source potential extraction regions 34 are formed on partial portions of the surfaces of the respective source regions 31. The source potential extraction region 34 contains an impurity of the same conductivity type as that of the source region 31, with impurity concentration higher than that of the source region 31, and is electrically connected to the source region 31. Over the surfaces of the respective source potential extraction regions 34, source electrodes 35 are formed with the intermediary of the vias 26 therebetween. The source electrode 35 is composed of e.g. a metal such as aluminum (Al) and is electrically connected to the source potential extraction region 34. Therefore, the source electrode 35 is electrically connected to the source region 31 via the via 26 and the source potential extraction region 34. The source electrode 35 is electrically connected also to the signal line $L_1$.

Between the source potential extraction region 34 and the second collector potential extraction region 25, an element isolation layer 50 that isolates these regions from each other is provided. Between the element including one bipolar transistor 20 and two MOS transistors 30 and another element formed over the semiconductor substrate 10, an element isolation layer 51 that isolates these elements from each other is provided. Moreover, the insulating layer 52 is formed on the part of the surface of the semiconductor substrate 10 on which the via 26 is not formed (specifically, on the partial portions exposed at the surface of the semiconductor substrate 10, of the collector region 21, the base region 22, the emitter region 23, the second collector potential extraction regions 25, the source regions 31, and the source potential extraction regions 34).

The element isolation layer 50 has e.g. a shallow trench isolation (STI) structure or a local-oxidation-of-silicon (LOCOS) structure, and the upper surface thereof is at a position slightly higher than that of the upper surface of the semiconductor substrate 10. The element isolation layer 51 has a lower isolation layer 51A and an upper isolation layer 51B. The lower isolation layer 51A contains e.g. an impurity of a conductivity type different from that of the collector region 21. The upper isolation layer 51B has e.g. an STI structure or a LOCOS structure, and the upper surface thereof is at a position slightly higher than that of the upper surface of the semiconductor substrate 10. The insulating layer 52 is composed of e.g. silicon oxide ($SiO_2$).

Figure 2:
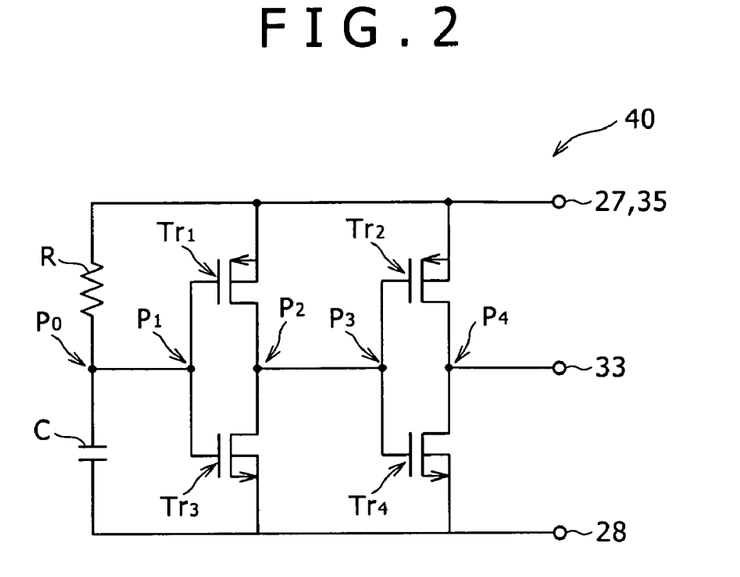
FIG. 2 is a circuit arrangement diagram of a control circuit of FIG. 1.

The control circuit 40 serves to electrically connect the gate electrode 33 and the ground line $L_3$ to each other when a surge voltage is applied to the signal line $L_1$, and electrically connect the gate electrode 33 and the ground line $L_1$ to each other when a signal voltage is applied to the signal line $L_1$. As shown in FIG. 2, this control circuit 40 includes e.g. two p-type MOS transistors Tr1 and Tr2, two n-type MOS transistors Tr3 and Tr4, a resistance element R, and a capacitance element C.

Each of the p-type MOS transistors Tr1 and Tr2 has a gate, source, drain, and n-type well (not shown) formed over the semiconductor substrate. Each of the n-type MOS transistors Tr3 and Tr4 has a gate, source, drain, and p-type well (not shown) formed over the semiconductor substrate.

For the p-type MOS transistor Tr1, the source and the n-type well are connected to the collector electrode 27 and the source electrode 35, the gate is connected to the gate of the n-type MOS transistor Tr3, and the drain is connected to the drain of the n-type MOS transistor Tr3. For the n-type MOS transistor Tr3, the source and the p-type well are connected to the emitter electrode 28, the gate is connected to the gate of the p-type MOS transistor Tr1 as described above, and the drain is connected to the drain of the p-type MOS transistor Tr1 as described above. A connecting node P1 between the gate of the p-type MOS transistor Tr1 and the gate of the n-type MOS transistor Tr3 is connected to a connecting node P0 of series connection between the resistance element R and the capacitance element C.

For the p-type MOS transistor Tr2, the source and the n-type well are connected to the collector electrode 27 and the source electrode 35, the gate is connected to the gate of the n-type MOS transistor Tr4, and the drain is connected to the drain of the n-type MOS transistor Tr4. For the n-type MOS transistor Tr4, the source and the p-type well are connected to the emitter electrode 28, the gate is connected to the gate of the p-type MOS transistor Tr2 as described above, and the drain is connected to the drain of the p-type MOS transistor Tr2 as described above. A connecting node P3 between the gate of the p-type MOS transistor Tr2 and the gate of the n-type MOS transistor Tr4 is connected to a connecting node P2 between the drain of the p-type MOS transistor Tr1 and the drain of the n-type MOS transistor Tr3. A connecting node P4 between the drain of the p-type MOS transistor Tr2 and the drain of the n-type MOS transistor Tr4 is connected to the gate electrode 33.

One end of the resistance element R is connected to the collector electrode 27 and the source electrode 35, and the other end of the resistance element R is connected to the connecting node P0. One end of the capacitance element C is connected to the connecting node P0, and the other end of the capacitance element C is connected to the emitter electrode 28.

Figure 3:
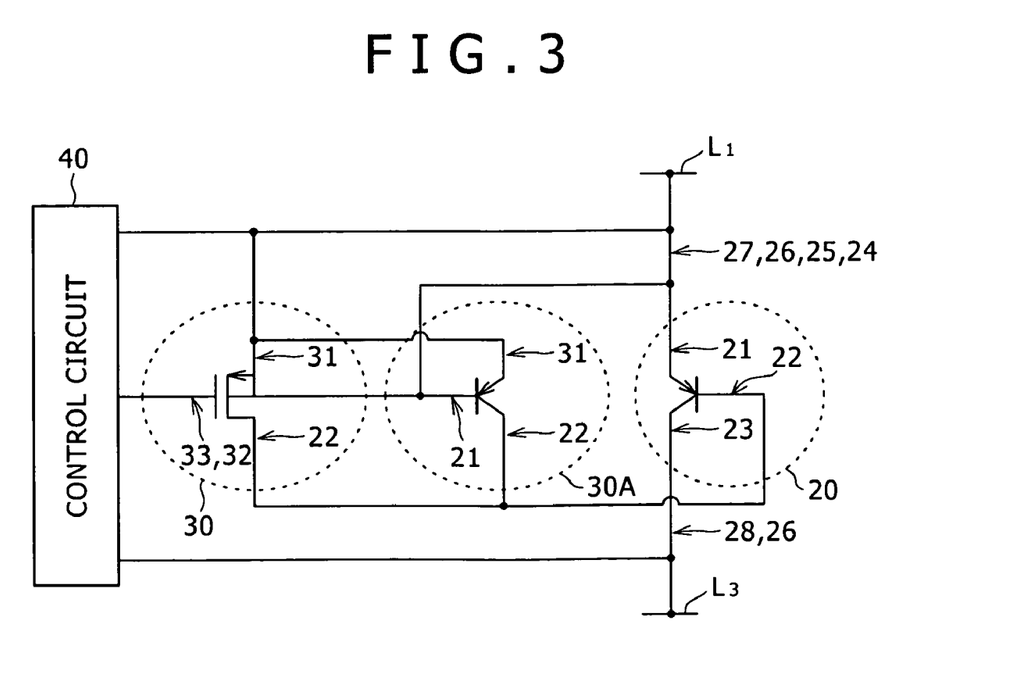
FIG. 3 is an equivalent circuit diagram of a bipolar transistor and MOS transistors of FIG. 1.

In the electrostatic protection circuit 1 of the present embodiment, one bipolar transistor 20 and two MOS transistors 30 shown in FIG. 1 can be represented by e.g. an equivalent circuit shown in FIG. 3. In this equivalent circuit, numeral 30A denotes a bipolar transistor composed of the source region 31 of the MOS transistor 30, the partial portion of the collector region 21 directly beneath the gate electrode 33 (so-called channel body), and the drain region (the base region 22).

As is apparent also from this equivalent circuit, in the present embodiment, the base region 22 of the bipolar transistor 20 and the drain region of the MOS transistor 30 are electrically connected to each other, and the drain region (the base region 22) is electrically floating.

Figure 4:
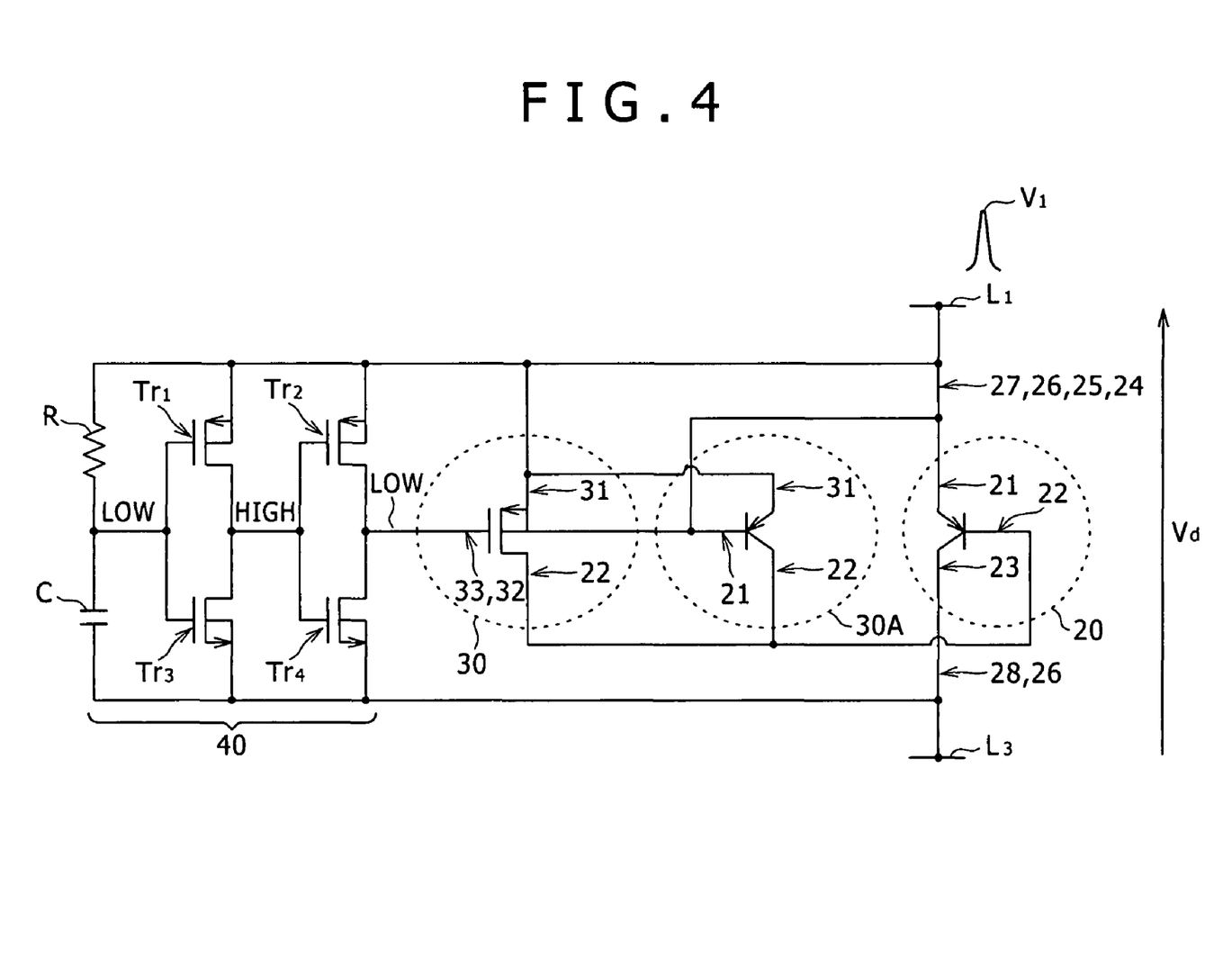
FIG. 4 is a circuit arrangement diagram for explaining operation when a surge voltage is applied to the electrostatic protection circuit of FIG. 1.

Due to this structure, when a surge voltage $V_1$ is applied to the signal line $L_1$ as shown in FIG. 4, the surge voltage $V_1$ is transmitted to the collector region 21 and the source region 31, so that the voltage of the collector region 21 and the source region 31 becomes the surge voltage $V_1$. At this time, in the control circuit 40, the surge voltage $V_1$, which rises up rapidly, is input before charging of the capacitance element C. Therefore, the gate potential of the p-type MOS transistor Tr1 is at Low, and thus the MOS transistor Tr1 is in the on-state. On the other hand, the n-type MOS transistor Tr3 is in the off-state, and therefore the output of the n-type MOS transistor Tr3 is at High. Thus, the p-type MOS transistor Tr2 is in the off-state, and the n-type MOS transistor Tr4 is in the on-state. Therefore, the output of the n-type MOS transistor Tr4 is at Low. As a result, the gate electrode 33 of the MOS transistor 30 is electrically connected to the ground line $L_3$ via the n-type MOS transistor Tr4. Furthermore, because the emitter electrode 28 is also electrically connected to the ground line $L_3$, a channel is formed in the partial portion of the collector region 21 directly beneath the gate electrode 33 (channel body), so that the surge voltage $V_1$ of the source region 31 is transmitted to the base region 22 via the channel. When the surge voltage $V_1$ is thus transmitted to the base region 22, the junction between the base region 22 and the emitter region 23 electrically connected to the ground line $L_3$ is forward-biased. In addition, because the voltage of the collector region 21 is the surge voltage $V_1$, the bipolar transistor 20 starts its bipolar operation, so that the surge voltage $V_1$ is discharged from the collector region 21 to the ground line $L_3$ via the base region 22, the emitter region 23, and the emitter electrode 28. Consequently, the surge voltage $V_1$ does not transmit in the signal line $L_1$ but is diverted into the ground line $L_3$ via the electrostatic protection circuit 1.

Figure 5:
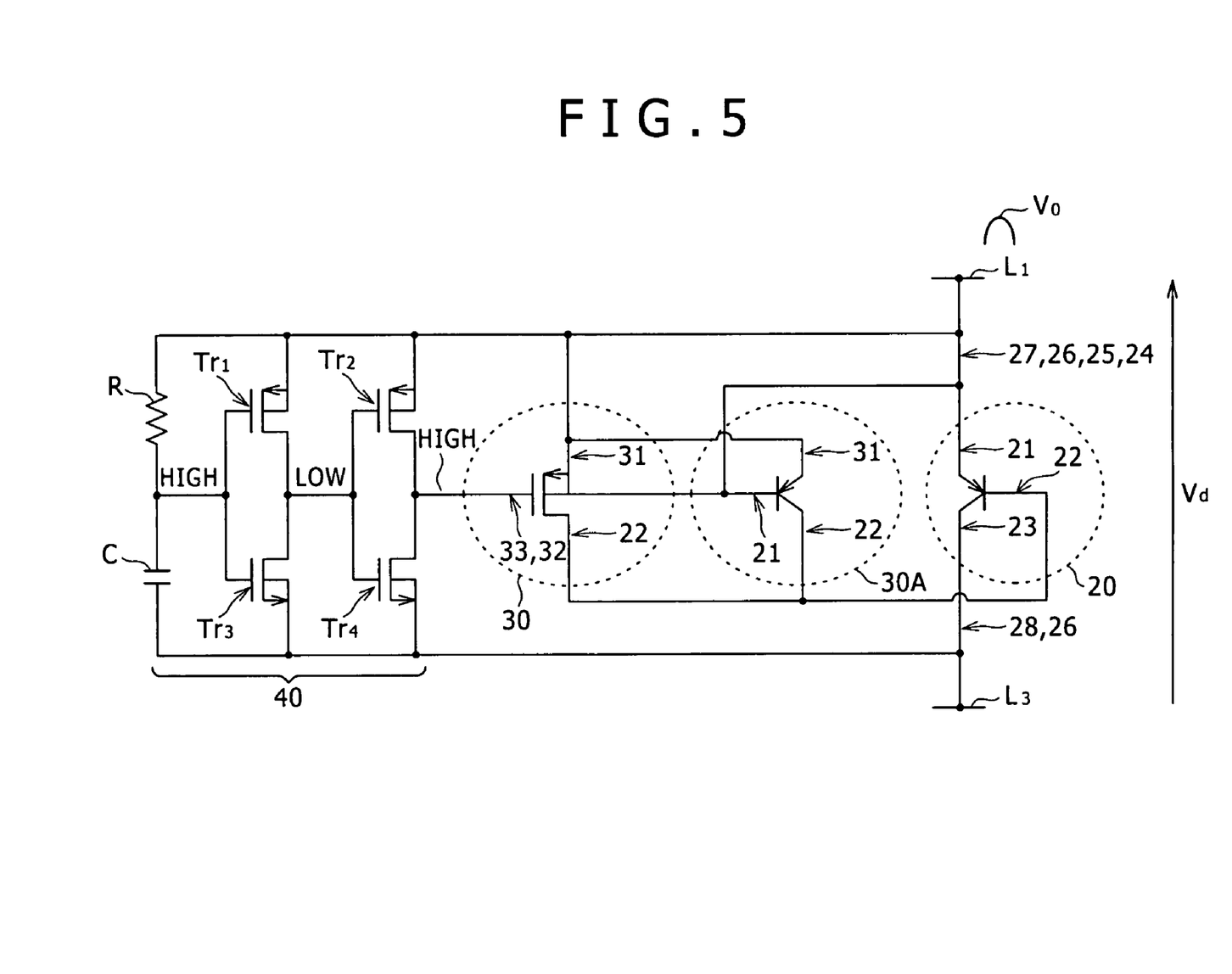
FIG. 5 is a circuit arrangement diagram for explaining operation when a signal voltage is applied to the electrostatic protection circuit of FIG. 1.

On the other hand, when a signal voltage $V_0$ is applied to the signal line $L_1$ as shown in FIG. 5, the capacitance element C is charged in the control circuit 40. Therefore, the gate potential of the p-type MOS transistor Tr1 is at High, and thus the MOS transistor Tr1 is in the off-state. On the other hand, the n-type MOS transistor Tr3 is in the on-state, and therefore the output of the n-type MOS transistor Tr3 is at Low. Thus, the p-type MOS transistor Tr2 is in the on-state, and the n-type MOS transistor Tr4 is in the off-state. Therefore, the output of the n-type MOS transistor Tr4 is at High. As a result, the gate electrode 33 of the MOS transistor 30 is not electrically connected to the ground line $L_3$ but electrically floating. Thus, the electrostatic protection circuit 1 does not operate, but the signal voltage $V_0$ transmits in the signal line $L_1$, so that the integrated circuit (not shown) connected to the signal line $L_1$ operates.

Figure 6:
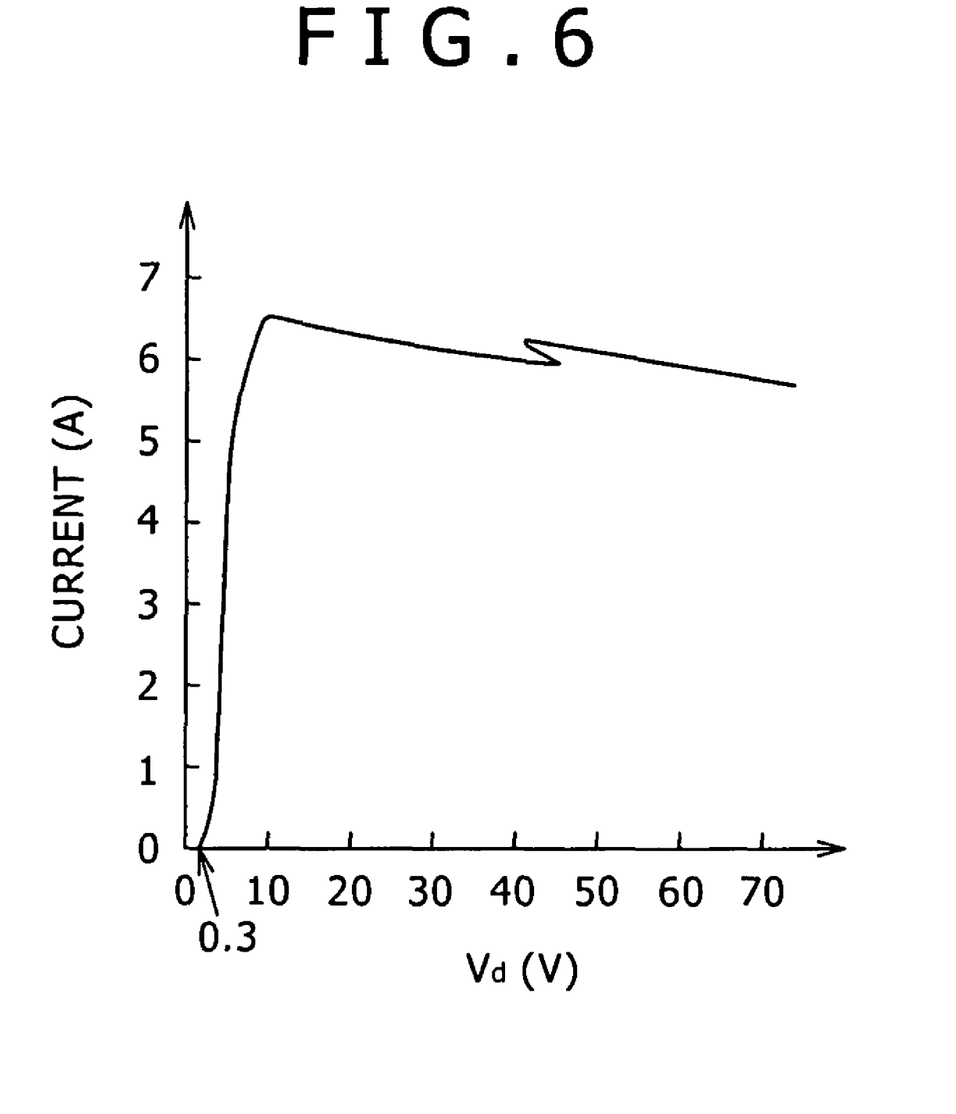
FIG. 6 is a characteristic diagram showing one example of the current-voltage characteristic of the electrostatic protection circuit of FIG. 1.

In this manner, in the present embodiment, the base region 22 is so designed as to serve as both the base of the bipolar transistor 20 and the drain of the MOS transistor 30. Thus, the trigger of the bipolar operation at the time of the electrostatic protection can be controlled based on the threshold voltage of the MOS transistor 30. Due to this feature, the electrostatic protection operation can be started even when the voltage Vd between the signal line $L_1$ and the ground line $L_3$ is low (e.g. 0.3 V) as shown in FIG. 6, which allows prevention of the breakdown of the electrostatic protection circuit 1 itself due to the surge voltage $V_1$.

Furthermore, the internal impedance at the time of the electrostatic protection operation is very low. Therefore, even when static electricity of high voltage is applied, the voltage Vd can be suppressed to as low as about 10 V, and thus low power consumption can be realized. This allows suppression of the heat generation of the electrostatic protection circuit 1, which greatly enhances the electrostatic protection resistance. Moreover, as shown in FIG. 6, the resistance can be maintained for large current of up to about 6.5 A. Thus, even when a high voltage of about 10400 V is applied in the human body model or a high voltage of about 520 V is applied in the machine model, the resistance can be maintained, and hence the electrostatic protection resistance is extremely excellent.

Second Embodiment

Figure 7:
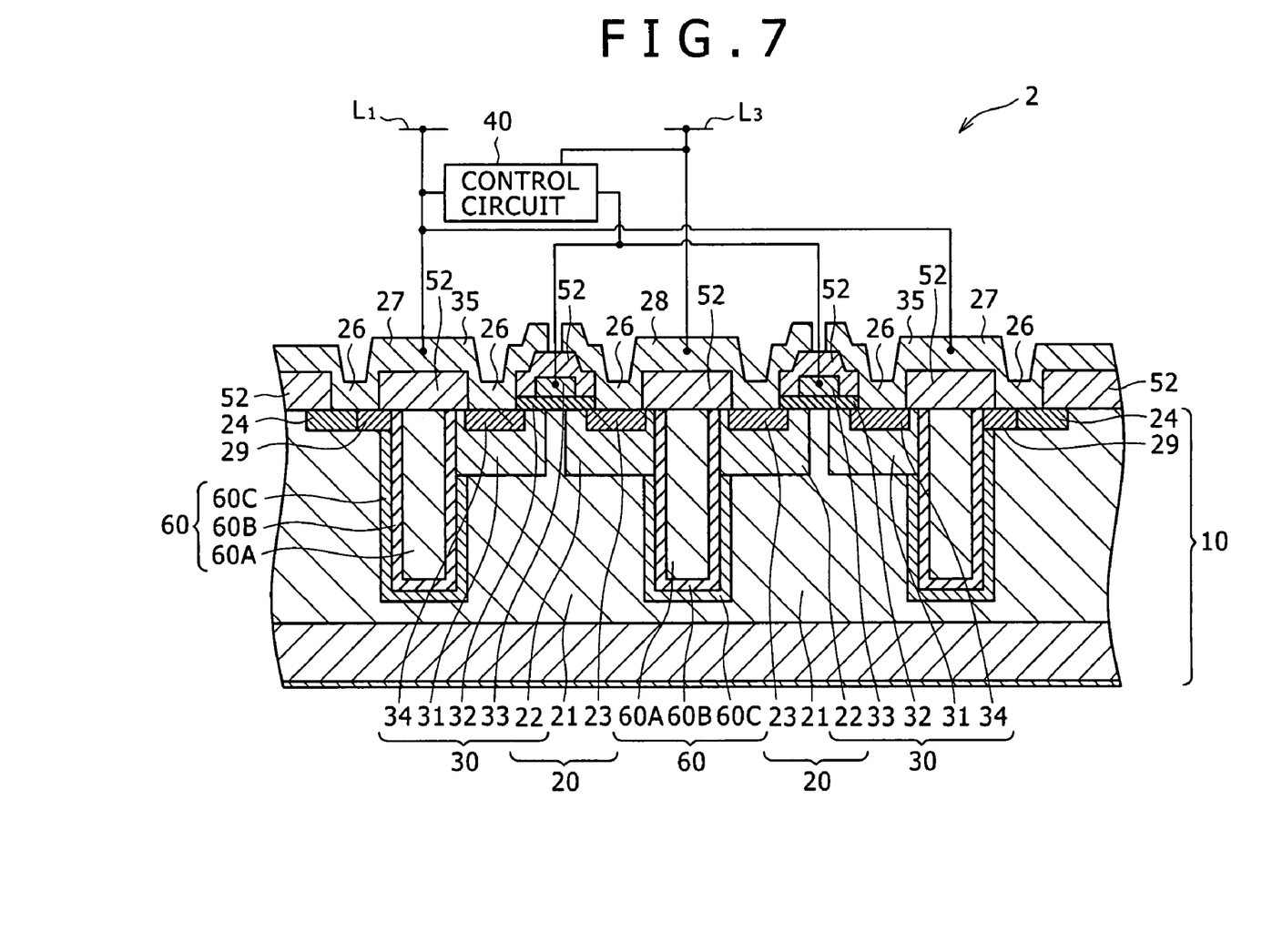
FIG. 7 is a sectional structural diagram of an electrostatic protection circuit according to a second embodiment of the present invention.

FIG. 7 is a diagram showing the sectional structure and the connection relationship of an electrostatic protection circuit 2 according to a second embodiment of the present invention. Similarly to the electrostatic protection circuit 1 of the above-described embodiment, the electrostatic protection circuit 2 of the present embodiment is formed over a silicon substrate together with an integrated circuit, and is provided and connected between the signal line L₁ electrically connected to the integrated circuit and the ground line L₃ (reference potential line).

As shown in FIG. 7, this electrostatic protection circuit 2 is different from the electrostatic protection circuit 1 of the above-described embodiment, mainly in that the base region 22 and the source region 31 of the above-described embodiment are provided with a pillar structure 60 in the electrostatic protection circuit 2. Furthermore, the electrostatic protection circuit 2 does not include the second collector potential extraction region 25 on the surface of the first collector potential extraction region 24 but includes a source potential extraction region 29 adjacent to the first collector potential extraction region 24. Also in this feature, the electrostatic protection circuit 2 is different from the electrostatic protection circuit 1 of the above-described embodiment, which includes the second collector potential extraction region 25 on the surface of the first collector potential extraction region 24 and does not include the source potential extraction region 29. In the following, the differences from the above-described embodiment will be mainly described, and the description of the common points of these embodiments is omitted according to need.

As shown in FIG. 7, this electrostatic protection circuit 2 includes two bipolar transistors 20, two MOS transistors 30, and three pillar structures 60.

Two bipolar transistors 20 are formed between two MOS transistors 30. The drain region of one of the MOS transistors 30 is electrically connected to the base region 22 of one of the bipolar transistors 20, or is formed monolithically with (or is used also as) this base region 22. The drain region of the other of the MOS transistors 30 is electrically connected to the base region 22 of the other of the bipolar transistors 20, or is formed monolithically with (or is used also as) this base region 22.

Of three pillar structures 60, one is formed between two bipolar transistors 20, another one is formed between one of the MOS transistors 30 and the first collector potential extraction region 24 adjacent thereto, and the remaining one is formed between the other of the MOS transistors 30 and the first collector potential extraction region 24 adjacent thereto. Each pillar structure 60 has e.g. a deep trench isolation (DTI) structure and a pillar shape that ranges from the outermost surface of the semiconductor substrate 10 to the vicinity of the bottom of the collector region 21. Furthermore, each pillar structure 60 has e.g. a multilayer structure obtained by stacking plural layers along the direction from the center of the pillar structure 60 toward the collector region 21. This multilayer structure is composed of e.g. a pillar layer 60A that has a pillar shape and is provided at the center of the multilayer structure, a pillar layer 60B that covers the side surfaces and the bottom of the pillar layer 60A, and a pillar layer 60C that covers the side surfaces and the bottom of the pillar layer 60B.

Of three pillar structures 60, in the pillar structure 60 provided between two bipolar transistors 20, the pillar layer 60A is surrounded by the pillar layer 60B and the insulating film 52 (insulating film 52A) formed on the pillar structure 60. Thus, the pillar layer 60A is spatially isolated from the collector region 21, the pillar layer 60C, and the base regions 22 in the periphery thereof. The pillar layer 60C is formed between the pillar layer 60B and the collector region 21, and is in contact with two base regions 22 adjacent to each other.

The pillar layer 60A contains e.g. poly-silicon containing an impurity of the same conductivity type as that of the semiconductor substrate 10. The pillar layer 60B is composed of e.g. silicon oxide (SiO₂), and insulates, together with the insulating film 52 (insulating film 52A) formed on the pillar structure 60, the pillar layer 60A from the collector region 21, the pillar layer 60C, and the base regions 22 in the periphery of the pillar layer 60A. The pillar layer 60C contains e.g. an impurity of a conductivity type different from that of the collector region 21, and is electrically connected to two base regions 22 adjacent to each other. Due to this structure, the pillar layer 60C has a roll of, when high voltage is applied to the collector electrode 27, causing the collector region 21 and the pillar layer 60C to be completely depleted and equalizing the electric field directly beneath the base region 22 to thereby increase the breakdown voltage.

Of three pillar structures 60, in two pillar structures 60 provided between one of the MOS transistors 30 and the first collector potential extraction region 24 adjacent thereto and provided between the other of the MOS transistors 30 and the first collector potential extraction region 24 adjacent thereto, the pillar layer 60A is surrounded by the pillar layer 60B and the insulating film 52 (insulating film 52A) formed on the pillar structure 60. Thus, the pillar layer 60A is spatially isolated from the collector region 21, the pillar layer 60C, the source region 31, and the source potential extraction region 29 (to be described later) in the periphery thereof. The pillar layer 60C is formed between the pillar layer 60B and the collector region 21, and is in contact with the source region 31 and the source potential extraction region 29 that are adjacent to each other with the intermediary of the pillar structure 60 therebetween.

The pillar layer 60A contains e.g. poly-silicon containing an impurity of the same conductivity type as that of the semiconductor substrate 10. The pillar layer 60B is composed of e.g. silicon oxide (SiO₂), and insulates, together with the insulating film 52 (insulating film 52A) formed on the pillar structure 60, the pillar layer 60A from the collector region 21, the pillar layer 60C, the source region 31, and the source potential extraction region 29 in the periphery of the pillar layer 60A. The pillar layer 60C contains e.g. an impurity of a conductivity type different from that of the collector region 21, and is electrically connected to the source region 31 and the source potential extraction region 29 that are adjacent to each other with the intermediary of the pillar structure 60 therebetween. Due to this structure, the pillar layer 60C has a roll of, when high voltage is applied to the collector electrode 27, causing the collector region 21 and the pillar layer 60C to be completely depleted and equalizing the electric field directly beneath the source region 31 to thereby increase the breakdown voltage.

The reason why the pillar layers 60A, 60B, and 60C are provided as the pillar structure 60 is that the following process is used in order to form the pillar layer 60C, which contributes to increase in the breakdown voltage, in terms of reduction in the manufacturing cost. Specifically, initially three deep trenches (not shown) are formed in predetermined areas in the collector region 21, and then the thin pillar layer 60B is formed in each deep trench. Subsequently, the pillar layer 60C is formed directly beneath the pillar layer 60B by oblique implantation and diffusion, and the pillar layer 60A is so formed on the pillar layer 60B as to fill the deep trench. In this way, the pillar structure 60 can be formed.

If the manufacturing cost is not taken into consideration, it is also possible to use the following process for forming the pillar structure 60, which contributes to increase in the breakdown voltage. Specifically, three deep trenches (not shown) are formed in predetermined areas in the collector region 21, and then the deep trenches are filled by growing e.g. a semiconductor layer (pillar layer) containing an impurity of a conductivity type different from that of the collector region 21 in the respective deep trenches.

The source potential extraction region 29 is provided on the outermost surface of the semiconductor substrate 10 together with the first collector potential extraction region 24. Over the surfaces of the source potential extraction region 29 and the first collector potential extraction region 24, the collector electrode 27 is formed with the intermediary of the via 26 therebetween. The source potential extraction region 29 contains an impurity of the same conductivity type as that of the pillar layer 60C, with impurity concentration higher than that of the pillar structure 60C. Due to this structure, the via 26 and the collector electrode 27 are electrically connected to the first collector potential extraction region 24 and the source potential extraction region 29. Furthermore, as described later, the source potential extraction region 29 is in contact with the pillar layer 60C, which is in contact with the source region 31, and thus is electrically connected to the source region 31 via the pillar layer 60C. Consequently, the collector electrode 27 is electrically connected to the collector region 21 via the via 26 and the first collector potential extraction region 24, and is electrically connected also to the source region 31 via the via 26, the source potential extraction region 29, and the pillar layer 60C. Moreover, the collector electrode 27 is electrically connected also to the signal line $L_1$.

In the electrostatic protection circuit 2 of the present embodiment, two bipolar transistors 20 and two MOS transistors 30 shown in FIG. 7 can be represented by e.g. the equivalent circuit shown in FIG. 3, similarly to the above-described embodiment. Therefore, also in the present embodiment, the base region 22 of the bipolar transistor 20 and the drain region of the MOS transistor 30 are electrically connected to each other, and the drain region (the base region 22) is electrically floating.

Due to this structure, when the surge voltage $V_1$ is applied to the signal line $L_1$ as shown in FIG. 4, the surge voltage $V_1$ does not transmit in the signal line $L_1$ but is diverted into the ground line $L_3$ via the electrostatic protection circuit 2, similarly to the above-described embodiment. On the other hand, when the signal voltage $V_0$ is applied to the signal line $L_1$ as shown in FIG. 5, the electrostatic protection circuit 2 does not operate, but the signal voltage $V_0$ transmits in the signal line $L_1$, so that the integrated circuit (not shown) connected to the signal line $L_1$ operates, similarly to the above-described embodiment.

In this manner, in the present embodiment, the base region 22 is so designed as to serve as both the base of the bipolar transistor 20 and the drain of the MOS transistor 30. Thus, the trigger of the bipolar operation at the time of the electrostatic protection can be controlled based on the threshold voltage of the MOS transistor 30. Due to this feature, the electrostatic protection operation can be started even when the voltage Vd between the signal line $L_1$ and the ground line $L_3$ is low (e.g. 0.3 V) as shown in FIG. 6, which allows prevention of the breakdown of the electrostatic protection circuit 2 itself due to the surge voltage $V_1$.

Furthermore, the internal impedance at the time of the electrostatic protection operation is very low. Therefore, even when static electricity of high voltage is applied, the voltage Vd can be suppressed to as low as about 10 V, and thus low power consumption can be realized. This allows suppression of the heat generation of the electrostatic protection circuit 2, which greatly enhances the electrostatic protection resistance. Moreover, as shown in FIG. 6, the resistance can be maintained for large current of up to about 6.5 A. Thus, even when a high voltage of about 10400 V is applied in the human body model or a high voltage of about 520 V is applied in the machine model, the resistance can be maintained, and hence the electrostatic protection resistance is extremely excellent.

This is the end of the description of the electrostatic protection circuits according to two embodiments of the present invention. The present invention is not limited to the above-described embodiments, but the structures of the electrostatic protection circuits can optionally be modified as long as the same advantageous effects as those by the above-described embodiments can be achieved.

Figure 8:
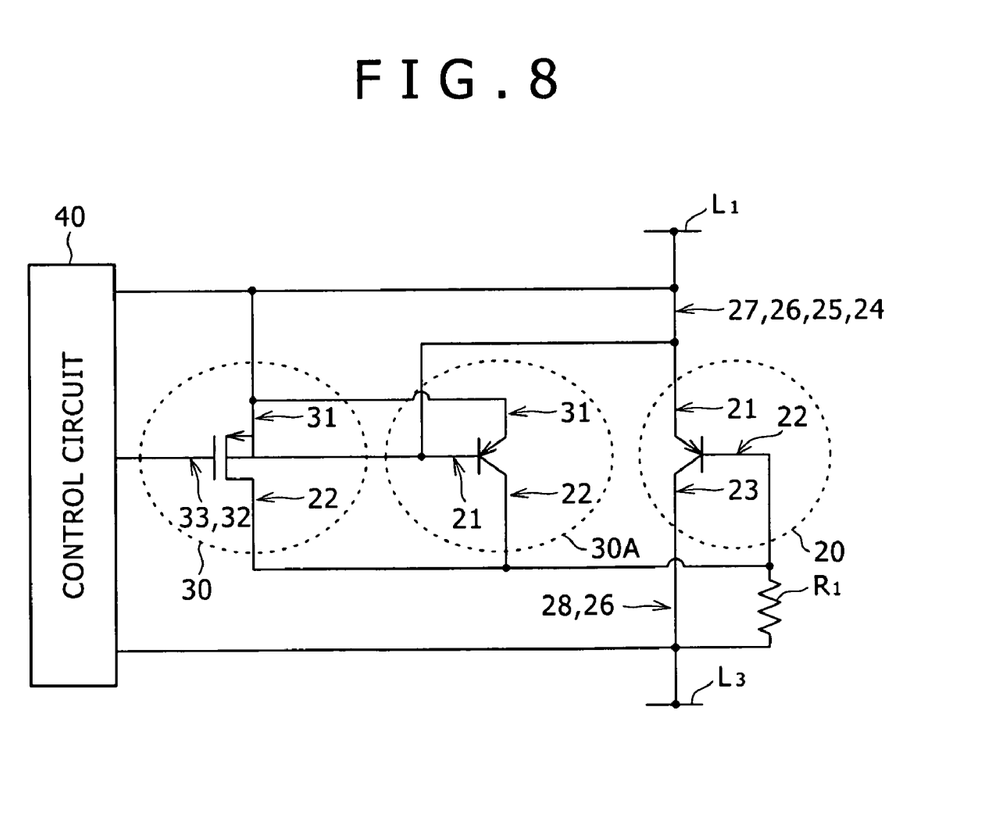
FIG. 8 is a circuit arrangement diagram of one modification example of the electrostatic protection circuit of FIG. 1 or FIG. 7.

For example, in the above-described embodiments, the drain region of the MOS transistor 30 (the base region 22 of the bipolar transistor 20) is electrically floating. Alternatively, it is also possible to employ e.g. a configuration in which a base electrode (not shown) electrically connected to the base region 22 is provided on a part of the surface of the base region 22 and a high-resistance element R1 is provided and connected between this base electrode and the ground line $L_3$. Due to this structure, for example, as shown in FIG. 8, the drain region of the MOS transistor 30 (the base region 22 of the bipolar transistor 20) is electrically connected to the ground line $L_3$ via the high-resistance element R1. Thus, erroneous operation due to noise can be prevented without deteriorating the electrically-floating state. Specifically, in the structures of the above-described embodiments, when the surge voltage $V_1$ is applied, the surge voltage $V_1$ of the source region 31 is transmitted via the channel to the base region 22 in the floating state, which offers the advantageous effect. Thus, the base region 22 should be set to the electrically-floating state. However, this would possibly cause erroneous operation due to noise. In contrast, if the high-resistance element R1 is provided like the present modification example, even in the case of the occurrence of noise, the noise can be discharged to the ground line $L_3$ via the high-resistance element R1, and thus the potential of the base region 22 can be stabilized, which allows prevention of erroneous operation due to the noise.

Figure 9:
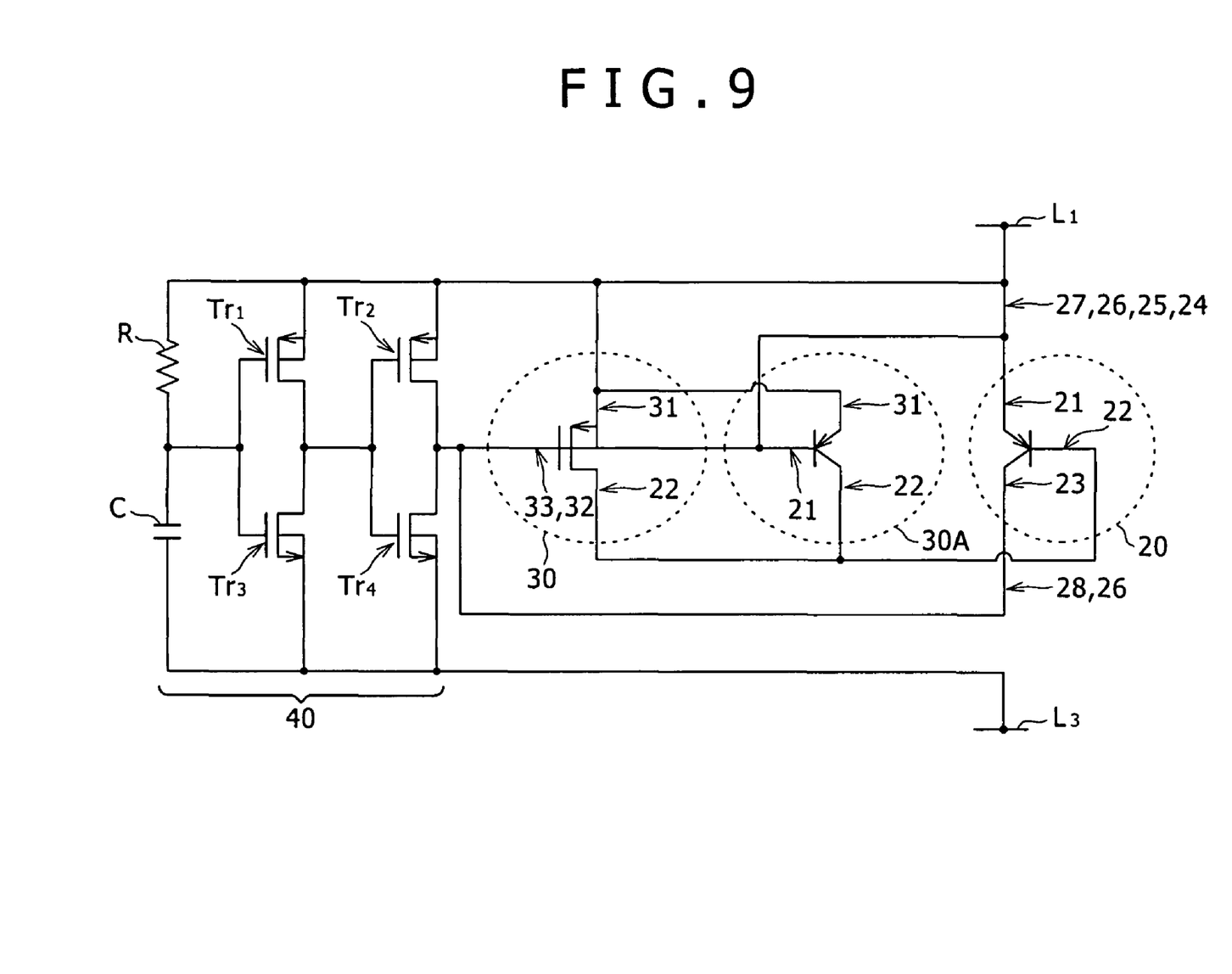
FIG. 9 is a circuit arrangement diagram of another modification example of the electrostatic protection circuit of FIG. 1 or FIG. 7.

In the above-described embodiments, the emitter electrode 28 is connected directly to the ground line $L_3$. Alternatively, it is also possible to employ e.g. a configuration shown in FIG. 9 in which the p-type MOS transistor Tr4 in the control circuit 40 is interposed between the emitter electrode 28 and the ground line $L_3$. In this case, due to the control circuit 40, the emitter electrode 28 and the gate electrode 33 are connected to the ground line $L_3$ via the p-type MOS transistor Tr4 when the surge voltage $V_1$ is applied to the signal line $L_1$, and are connected to the signal line $L_1$ via the p-type MOS transistor Tr2 when the signal voltage $V_0$ is applied to the signal line $L_1$.

In the above-described embodiments, the semiconductor substrate 10 is a silicon substrate containing a p-type impurity. Alternatively, it may be a silicon substrate containing an n-type impurity. In this case, when the conductivity type of another component is the p-type, this conductivity type is replaced by the n-type. When the conductivity type of another component is the n-type, this conductivity type is replaced by the p-type.

In the above-described embodiments, two MOS transistors 30 are provided. Alternatively, only one MOS transistor 30 may be provided, or three or more MOS transistors 30 may be provided. In the first embodiment, one bipolar transistor 20 is provided. Alternatively, two or more bipolar transistors 20 may be provided. In the second embodiment, two bipolar transistors 20 are provided. Alternatively, only one bipolar transistor 20 may be provided, or three or more bipolar transistors 20 may be provided.

It should be understood by those skilled in the art that various modifications, combinations, sub-combinations and alterations may occur depending on design requirements and other factors insofar as they are within the scope of the appended claims or the equivalents thereof.

What is claimed is:

1. An electrostatic discharge protection circuit comprising:
a first impurity region configured to contain an impurity of a first conductivity type;
a second impurity region configured to be formed on a surface of the first impurity region and contain an impurity of the first conductivity type with concentration higher than concentration of the impurity of the first conductivity type in the first impurity region;
a first electrode configured to be formed on a surface of the second impurity region and be electrically connected to a signal line;
a third impurity region configured to be formed on the surface of the first impurity region and contain an impurity of a second conductivity type different from the first conductivity type;
a fourth impurity region configured to be formed on a surface of the third impurity region and contain an impurity of the second conductivity type with concentration higher than concentration of the impurity of the second conductivity type in the third impurity region;
a second electrode configured to be formed on a surface of the fourth impurity region and be electrically connected to the signal line;
a fifth impurity region configured to be formed in an area adjacent to the third impurity region, of a surface area of the first impurity region, and contain an impurity of the second conductivity type;
a sixth impurity region configured to be formed on a surface of the fifth impurity region and contain an impurity of the first conductivity type;
a third electrode configured to be formed on a surface of the sixth impurity region and be electrically connected to a reference potential line;
a gate insulating film configured to be formed at least on a part of the surface of the first impurity region, between the third impurity region and the fifth impurity region; and
a fourth electrode configured to be formed on a surface of the gate insulating film and be electrically connected to the reference potential line when a surge voltage is applied to the signal line.

2. The electrostatic discharge protection circuit according to claim 1, wherein
the third electrode is always electrically connected to the reference potential line.

3. The electrostatic discharge protection circuit according to claim 1, wherein
the third electrode is electrically connected to the reference potential line when a surge voltage is applied to the signal line.

4. The electrostatic discharge protection circuit according to claim 1, wherein
the fifth impurity region is electrically floating.

5. The electrostatic discharge protection circuit according to claim 1, further comprising:
a fifth electrode configured to be formed on a part of the surface of the fifth impurity region; and
a high-resistance element configured to be provided and connected between the fifth electrode and the reference potential line.

6. The electrostatic discharge protection circuit according to claim 2, further comprising
a control circuit configured to electrically connect the fourth electrode to the reference potential line when a surge voltage is applied to the signal line, and electrically connect the fourth electrode to the signal line when a signal voltage is applied to the signal line.

7. The electrostatic discharge protection circuit according to claim 3, further comprising
a control circuit configured to electrically connect the third electrode and the fourth electrode to the reference potential line when a surge voltage is applied to the signal line, and electrically connect the third electrode and the fourth electrode to the signal line when a signal voltage is applied to the signal line.

8. A semiconductor device including an electrostatic protection circuit over a semiconductor substrate, the electrostatic discharge protection circuit comprising:
a first impurity region configured to contain an impurity of a first conductivity type;
a second impurity region configured to be formed on a surface of the first impurity region and contain an impurity of the first conductivity type with concentration higher than concentration of the impurity of the first conductivity type in the first impurity region;
a first electrode configured to be formed on a surface of the second impurity region and be electrically connected to a signal line;
a third impurity region configured to be formed on the surface of the first impurity region and contain an impurity of a second conductivity type different from the first conductivity type;
a fourth impurity region configured to be formed on a surface of the third impurity region and contain an impurity of the second conductivity type with concentration higher than concentration of the impurity of the second conductivity type in the third impurity region;
a second electrode configured to be formed on a surface of the fourth impurity region and be electrically connected to the signal line;
a fifth impurity region configured to be formed in an area adjacent to the third impurity region, of a surface area of the first impurity region, and contain an impurity of the second conductivity type;
a sixth impurity region configured to be formed on a surface of the fifth impurity region and contain an impurity of the first conductivity type;
a third electrode configured to be formed on a surface of the sixth impurity region and be electrically connected to a reference potential line;
a gate insulating film configured to be formed at least on a part of the surface of the first impurity region, between the third impurity region and the fifth impurity region; and
a fourth electrode configured to be formed on a surface of the gate insulating film and be electrically connected to the reference potential line when a surge voltage is applied to the signal line.

* * * * *